United States Patent [19]

Rideout

[11] 4,085,498
[45] Apr. 25, 1978

[54] FABRICATION OF INTEGRATED CIRCUITS CONTAINING ENHANCEMENT-MODE FETS AND DEPLETION-MODE FETS WITH TWO LAYERS OF POLYCRYSTALLINE SILICON UTILIZING FIVE BASIC PATTERN DELINEATING STEPS

[75] Inventor: Vincent L. Rideout, Mohegan Lake, N.Y.

[73] Assignee: International Business Machines Corporation, Armonk, N.Y.

[21] Appl. No.: 702,247

[22] Filed: Jul. 2, 1976

Related U.S. Application Data

[63] Continuation-in-part of Ser. No. 656,756, Feb. 9, 1976.

[51] Int. Cl.² .................. H01L 21/28; H01L 29/78; B01J 17/00
[52] U.S. Cl. .................. 29/571; 29/577 R; 29/578; 148/1.5; 148/187; 156/653; 156/655; 156/657; 156/659; 156/662; 357/23; 357/41; 357/42; 357/51; 357/59
[58] Field of Search .................. 148/1.5, 187; 357/23, 357/41, 42, 51; 29/571, 577, 578; 156/653, 655, 657, 659, 662

[56] References Cited

U.S. PATENT DOCUMENTS

| 3,387,286 | 6/1968 | Dennard | 148/187 X |
| 3,653,978 | 4/1972 | Robinson et al. | 357/41 X |
| 3,696,276 | 10/1972 | Boland | 357/23 |
| 3,775,191 | 11/1973 | McQuhae | 29/571 X |
| 3,811,076 | 5/1974 | Smith | 357/23 X |
| 3,865,652 | 2/1975 | Agusta et al. | 148/187 |
| 3,886,003 | 5/1975 | Takagi et al. | 148/187 |
| 3,897,282 | 7/1975 | White | 357/41 X |
| 3,936,862 | 2/1976 | Moyle | 357/41 |
| 3,958,323 | 5/1976 | De La Moneda | 29/571 |
| 4,033,026 | 7/1977 | Pashley | 29/571 |

OTHER PUBLICATIONS

Rideout, V. L., "Masking for One-Device Cell . . . Polysilicon Contacts", I.B.M. Tech. Discl. Bull., vol. 17, No. 9, Feb. 1975, pp. 2802–2804.

Bassous, E., "Fabricating Submicrometer Silicon Devices".

Ibid, vol. 15, No. 6, Nov. 1972, pp. 1823–1825.

Primary Examiner—L. Dewayne Rutledge
Assistant Examiner—W. G. Saba
Attorney, Agent, or Firm—Pollock, Vande Sande & Priddy

[57] ABSTRACT

Enhancement-mode field-effect transistors (FETs) and depletion-mode FETs are provided on the same semiconductive substrate using five basic, lithographic, pattern-delineating steps. The five lithographic masking steps delineate in order:

(1) the field isolation regions;
(2) the enhancement-mode FET gate electrodes;
(3) the depletion-mode FET gate electrodes;
(4) contact holes or vias to FET source and drain regions and to depletion-mode FET gates; and
(5) the high electrical conductivity metallic-type interconnection pattern.

The low-concentration doping required to form the depletion-mode channel regions is provided after the second but before the third pattern delineation step, while the high-concentration doping to form the source and drain regions is provided after the third pattern delineation step. In order to obtain the desired device structure, it is necessary to use two separately defined polycrystalline silicon regions for the gate electrodes of the enhancement-mode and depletion-mode FETs. Using the five basic lithographic masking steps, FET integrated circuits can be fabricated that contain both enhancement-mode and depletion-mode FETs interconnected as desired.

26 Claims, 18 Drawing Figures

FABRICATION OF INTEGRATED CIRCUITS CONTAINING ENHANCEMENT-MODE FETS AND DEPLETION-MODE FETS WITH TWO LAYERS OF POLYCRYSTALLINE SILICON UTILIZING FIVE BASIC PATTERN DELINEATING STEPS

CROSS REFERENCES TO RELATED APPLICATIONS

This application is a continuation-in-part of my copending U.S. patent application Ser. No. 656,756 filed on Feb. 9, 1976 and entitled "FET One Device Memory Cells with Two Layers of Polycrystalline Silicon and Fabrication of Integrated Circuits Containing Arrays of the Memory Cells".

BACKGROUND OF THE INVENTION

The present invention relates generally to enhancement-mode or "normally-off" field-effect transistors (FETs) and depletion-mode or "normally-on" FETs provided on the same semiconductive substrate, and the fabrication thereof using five basic lithographic, pattern-delineating steps. The five lithographic masking steps delineate in order:
(1) the field isolation regions;
(2) the enhancement-mode FET gate electrodes;
(3) the depletion-mode FET gate electrodes;
(4) contact holes or vias to FET source and drain regions and to depletion-mode FET gates; and
(5) the high electrical-conductivity metallic-type interconnection pattern.

Using the five basic masking steps, enhancement-mode and depletion-mode FETs can be fabricated and interconnected as desired to provide integrated circuits.

More particularly, the present invention relates to enhancement-mode FETs and depletion-mode FETs on the same semiconductive substrate which are formed from two separately deposited polycrystalline silicon (i.e., polysilicon) layers.

Depletion-mode FETs are known in the art and are generally used in FET integrated circuits as nonlinear load devices to provide a more favorable current-voltage relationship than is possible with linear load circuits using resistors or enhancement-mode devices. Enhancement-mode FETs are also known in the art and are used in digital integrated circuits as switches to prevent or allow the flow of electrical currents (i.e., signals).

Enhancement-mode and depletion-mode FETs are often fabricated on the same semiconductive substrate or chip to provide an integrated circuit such as a microprocessor. Fabrication of such integrated circuits requires at least five basic lithographic masking steps and generally utilizes one layer of polysilicon to provide the gate electrodes of both the enhancement-mode and depletion-mode FETs. Known fabrication methods generally employ conventional etched contact holes to provide electrical connection between the polysilicon gate electrodes and the metallic-type interconnection pattern. The present invention can likewise be used to fabricate both enhancement-mode and depletion-mode FETs on the same semiconductive substrate, whereby only five basic lithographic masking steps are required. In comparison to known methods, however, a number of particular advantages can be achieved with the present invention which arise from the unique utilization of two layers of polysilicon.

One unique aspect of the present invention is that, since the enhancement-mode and depletion-mode gate electrodes are formed from different steps, a nonoxidizing masking layer can be used to define the enhancement-mode gate electrode. This provides a self-registering or misregistration tolerant electrical connection between the gate electrode of the enhancement-mode FET and the metallic interconnection line pattern. This leads to FETs and integrated circuits of higher relative density than those attainable with conventional etched contact holes to the enhancement-mode gate electrodes.

Another unique aspect of the present invention is that, since the enhancement-mode gate electrode is fabricated before the depletion-modegate electrode and from a different layer of polysilicon, a blanket or maskless doping to form the depletion-mode channel regions may be made after forming the enhancement-mode gate electrode but before forming the depletion-mode gate electrode. Thus, an additional masking step is not required. In the present invention, the doping to form the source and drain regions of the FETs is provided after forming the depletion-mode gate electrodes from the second layer of polysilicon. Since the source and drain doping is of the same type, but of much greater concentration than the depletion-mode channel doping, the source and drain doping overlays and complements the maskless depletion-mode channel doping in the source and drain regions.

In addition, other more particular advantages can be achieved when the present invention is employed to fabricate a dynamic random-access memory chip containing an array of one-device memory cells. In the one switching device per cell or one-device cell, the enhancement-mode FET acts as a switch to allow electronic charges to enter or leave a storage capacitor. The presence or absence of charge on the storage capacitor represents binary information. The enhancement-mode FET with its self-registering gate contact of the present invention provides a high density switch for the one-device cell. Uniquely, the fabrication step used to provide the gate electrode structure of the depletion-mode FET can be used to provide the charge storage capacitor. In particular, the doping which provides the depletion-mode channel doping also provides the lower electrode, the gate insulator of the depletion-mode FET provides the dielectric insulation layer, and the polysilicon gate electrode of the depletion-mode FET provides the upper electrode of the charge storage capacitor. Furthermore, both enhancement-mode and depletion-mode devices are used in the peripheral circuits of the random-access memory chip.

When the depletion-mode gate structure is used to form the charge storage capacitor, the biasing requirements for the memory cell are relieved. In addition, the depletion-mode FET can serve in its conventional capacity as a nonlinear load device in the driver circuit peripheral to the array, and as a current limiter for the upper electrode of the storage capacitor.

The one-device memory cells to which the present invention is also directed are of the type referred to as metal word line/diffused bit line cells as distinguished from metal bit line/polysilicon word line cells. The present invention requires only five basic, lithographic, pattern-delineating, masking steps to achieve the desired integrated circuit comprising an array of one-device memory cells and the associated addressing, decoding, and sensing circuits which are positioned peripherally to the array of cells.

SUMMARY OF THE INVENTION

The present invention is directed to certain enhancement-mode and depletion-mode FETs and to a method for fabricating a semiconductor integrated circuit having at least one such enhancement-mode FET and one such depletion-mode FET device formed therein. The enhancement-mode and depletion-mode FETs may be interconnected as desired to form an integrated circuit. Each FET has source, drain, and channel regions. Electrical connections are provided to the source, drain, gate electrode, and substrate regions of the FETs for the purpose of applying or obtaining electrical signals.

The fabrication method requires five basic, lithographic, pattern-delineating steps. Two critical doping steps in the process provide a low-concentration doping layer for the depletion-mode channel regions, and a high-concentration doping for the source and drain regions. The method of the present invention requires that two separately deposited layers of polysilicon be used to provide the enhancement-mode gate electrodes and the depletion-mode gate electrodes. The particular sequence of the five lithographic masking steps and the two doping steps provided by the present invention along with the use of two layers of polysilicon provide densely packed integrated circuits containing enhancement-mode and depletion-mode FETs.

The present invention is particularly advantageous when employed to fabricate charge storage capacitors along with the depletion-mode and enhancement-mode FETs such as a dynamic random-access memory chip comprising an array of one-device memory cells and associated sensing, addressing, decoding, and clocking circuits located on the same chip but peripheral to the array of cells. Each cell consists of an enhancement-mode FET switch and a charge storage capacitor. The enhancement-mode FET serves to charge or discharge the capacitor and the presence or absence of charge on the capacitor represents binary information.

Conventionally, the capacitor is fabricated with the same materials and steps used to provide the gate electrode of the enhancement-mode FET, however, a unique approach is utilized according to the present invention whereby the fabrication steps which are employed to provide the gate electrode structure of the depletion-mode FET are also utilized to provide the charge storage capacitor. The doping for the channel region of the depletion-mode device also provides the lower electrode of the capacitor. The polysilicon layer used for forming the polysilicon gate electrode of the depletion-mode FET is also used for forming the upper electrode of the charge storage capacitor. Also the material used to provide the gate insulator is also used to provide the insulator for the charge storage capacitor.

The present invention provides certain biasing advantages when charge storage capacitors are present such as in memory cells. In particular, in other known devices in which the charge storage capacitor is formed along with the enhancement-mode gate electrode structure, an additional voltage level is required for the upper capacitor electrode to maintain an inversion layer under the electrode at the surface of the semiconductive substrate. Generally, the voltage supplied to the upper capacitor electrode is larger in absolute magnitude than the voltage supplied to the word line, and different in polarity from that supplied to the semiconductive substrate. When the doping employed to provide the channel doping for the depletion-mode FET is also used to provide the lower electrode of the charge storage capacitor according to the present invention, the threshold voltage necessary to create a surface inversion layer is lowered, and a lower voltage is required for the upper capacitor electrode. This reduction in the required voltage for the upper capacitor electrode makes it possible to operate the word line and the upper capacitor electrode at the same voltage level. This advantageously reduces two different voltage levels to one. In addition, the required magnitude of the bias on the upper electrode of the capacitor is reduced. This in turn lowers the electric field strength across the capacitor dielectric and leads to higher reliability circuits.

The present invention also provides a memory cell of very small dimensions and an integrated memory circuit of very high packing density.

The enhancement-mode FET, the depletion-mode FET, and/or the one-device memory cell of the integrated circuit are surrounded by a relatively thick isolation region commonly referred to as the field oxide region. The field oxide serves to electrically isolate one FET or memory cell from other like FETs and/or memory cells which are present on the same semiconductive substrate. This field oxide may be formed by thermal oxidation of the semiconductive substrate or by well known vacuum or chemical vapor deposition techniques. The field oxide may be formed on the surface of the semiconductive substrate or it may be partially or fully recessed into the semiconductive substrate such as described by Dennard, Rideout, and Walker in U.S. Pat. No. 3,899,363.

The gate electrodes of the enhancement-mode and the depletion-mode FETs, and the upper electrode of the charge storage capacitor, when present, are of polysilicon. The fabrication of the enhancement-mode gate is performed prior to and in a separate lithographic masking step from the fabrication of the depletion-mode gate.

Two separate layers of polysilicon are used to form the enhancement-mode FET gates and depletion-mode FET gates and upper capacitor electrodes, when present. The polysilicon layer for fabrication of the enhancement-mode gates is deposited separately and prior to the polysilicon layer employed for fabrication of the depletion-mode gates and upper storage capacitor electrodes. This fabrication sequence makes it possible to preserve an oxidation barrier masking layer above the enhancement-mode gates, to provide a doped lower capacitor electrode beneath the polysilicon upper capacitor electrodes, to provide a doped channel region beneath the depletion-mode polysilicon gate electrodes, and to provide a thick insulation oxide over the polysilicon upper capacitor electrodes and over the depletion-mode polysilicon gate. The oxidation barrier masking layer is used to delineate the enhancement-mode gate region and to preserve the polysilicon gate material of the enhancement-mode FET during the growth of the oxide insulation layer. When the oxidation barrier layer is removed, the entire gate region is revealed for contacting. A metallic-type interconnection line that passes over any portion of the enhancement-mode gate electrode will make electrical connection to that gate thus providing a self-registering or misregistration tolerant contact to the gate electrode.

In particular, the present invention is concerned with a method for fabricating both enhancement-mode and depletion-mode FETs on the same semiconductive substrate with only five basic lithographic masking pattern-delineating steps.

The five basic lithographic masking fabrication steps and sequence required by the present invention are as follows:
(1) delineating field isolation regions as distinguished from the device regions;
(2) delineating FET enhancement-mode gate electrodes from a first polysilicon layer;
(3) delineating FET depletion-mode gate pattern from a second and subsequently deposited polysilicon layer;
(4) delineating contact hole pattern to provide vias to FET depletion-mode gates, and to enhancement-mode and depletion-mode source and drain regions; and
(5) delineating high-electrical conductivity metallic-type interconnection pattern.

The contact holes or vias referred to in step (4) above do not generally appear in an array of enhancement-mode FETs but rather appear in circuits peripheral to the array of enhancement-mode FETs.

The present invention is also directed to integrated circuits obtained by the above-discussed process.

Another aspect of the present invention is the fabrication of an array of enhancement-mode FETs and charge storage capacitors, and depletion-mode FETs and enhancement-mode FETs in circuits peripheral to the array with only five basic lithographic masking steps. The five lithographic masking steps delineate in order:
(1) the field isolation regions;
(2) the enhancement-mode FET gate electrodes;
(3) the depletion-mode FET gate electrodes and the storage capacitor upper electrodes;
(4) contact holes or vias to FET source and drain regions, to depletion-mode FET gates, and to upper storage capacitor electrodes; and
(5) the high-electrical conductivity metallic-type interconnection pattern.

The contact hole or vias referred to in step (4) above do not appear in the array but rather appear in circuits peripheral to the array.

Another aspect of the present invention is a random-access memory integrated circuit comprising an array of dynamic one-device memory cells wherein each cell contains an enhancement-mode FET switch and a charge storage capacitor; and circuits peripheral to the array containing both enhancement-mode FETs and depletion-mode FETs; and wherein the integrated circuit comprises:
(A) a semiconductive substrate of a first conductive type containing active impurities of a first conductive type;
(B) doped polycrystalline silicon FET enhancement-mode gate electrodes delineated from a first layer of polycrystalline silicon;
(C) doped polycrystalline silicon electrodes delineated from a second layer of polycrystalline silicon deposited subsequent to said first layer of polycrystalline silicon, wherein the electrodes delineated from said second layer which are located in the array provide the upper electrodes of the charge storage capacitors, and wherein the electrodes delineated from said second layer which are located in circuits peripheral to the array provide the FET depletion-mode gate electrodes;
(D) low concentration doping of a second and opposite conductive type beneath the electrodes delineated from the second layer, wherein the doping which is in the array provides the lower electrodes of the charge storage capacitors, and wherein the doping which is in the circuits peripheral to the array provides the depletion-mode channel regions;
(E) high concentration doping of a second and opposite conductive type wherein the high concentration doping which is in the array provides the doped bit line and the electrical connection between the FET switches and the lower electrodes of the charge storage capacitors; and wherein the high concentration doping which is in the circuits peripheral to the array provides the source and drain regions for both the enhancement mode FETs and depletion mode FETs located in the circuits peripheral to the array;
(F) a high-electrical conductivity metallic-type pattern wherein the metallic-type pattern which is in the array provides the word lines to the memory cells, and the metallic-type pattern in the circuits peripheral to the array serves as an interconnection line pattern;
(G) self-registering electrical connection between polycrystalline silicon enhancement-mode gate electrodes and the metallic-type high-electrical conductivity pattern.

DESCRIPTION OF PREFERRED EMBODIMENTS

For convenience, the discussion of the fabrication steps is directed to the preferred aspect of preparing an integrated circuit array containing FET one-device memory cell and enhancement-mode and depletion-mode FETs. Accordingly, it is understood that the present invention can be employed to fabricate combinations of enhancement-mode and depletion-mode FETs in general.

Also, for convenience, the discussion of the fabrication steps is directed to the preferred aspects of employing a p-type silicon substrate as the semiconductive substrate and n-type impurities as the diffused or implanted dopant impurities in the source and drain regions. This leads to the n-type channel FET technology. Accordingly, it is understood that an n-type substrate and p-type diffused or implanted dopant impurities in the source and drain regions can be employed according to the present invention in the p-type channel FET technology.

It is understood that when the discussion refers to n-type impurities, the process steps are applicable to p-type impurities and vice versa. Also, the present invention is applicable to substrates other than silicon which are known in the art. Also, as used herein, the terms "metallic-type interconnection lines" or "high electrical conductivity interconnection lines" refers to lines or stripes of a metal such as aluminum as well as to nonmetallic materials such as highly doped polysilicon of intermetallic silicides which nevertheless can have electrical conductivities of the magnitude generally possessed by metals. Moreover, the terms "polysilicon" and "polycrystalline silicon" are used herein interchangeably as in the prior art. Also, when reference is made to impurities of a "first type" and to impurities of the "second type", it is understood that the "first type" refers to $n$ or p-type impurities and "second type" refers to the opposite condictivity type. That is, if the "first type" is $p$, then the "second type" is $n$. If the "first type" is $n$, then the "second type" is $p$. As used herein, the terms "gate" and "gate electrode" are interchangeable.

Figure 1A:
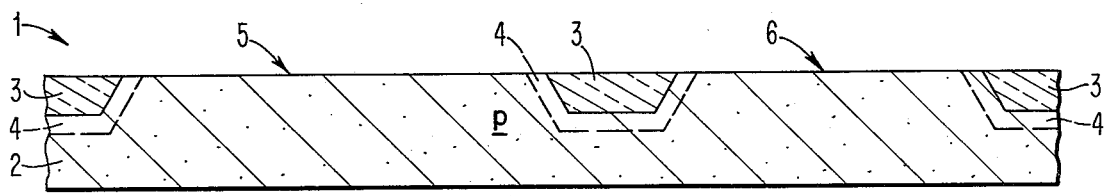
FIGS. 1A–1J are cross-sectional views taken along the lines indicated in FIG. 2 of an FET one-device memory cell and an FET depletion-mode device in various stages of fabrication.

Referring to FIG. 1A, there is shown a fragment of the initial structure of the invention generally shown as 1. A p-type silicon substrate 2 having any desired crystal orientation (e.g., <100>) is prepared by slicing and polishing a p-type silicon boule grown in the presence of a p-type dopant such as boron following conventional crystal growth techniques. Other p-types dopants for silicon include aluminum, gallium, and indium.

As discussed hereinabove, the field oxide isolation can be fabricated by any of several known procedures including thermal oxidation of the semiconductor substrate or by well known vacuum or chemical vapor deposition techniques. Furthermore, the field oxide may be formed above the semiconductive surface or it may be partially or fully recessed into the semiconductive substrate. An example of one such procedure is the fully recessed oxide isolation technique disclosed in U.S. Pat. No. 3,899,363, disclosure of which is incorporated herein by reference. For the purpose of illustration of the five masking step procedure of the present invention, a fully recessed field isolation oxide will be used.

Figure 2A:
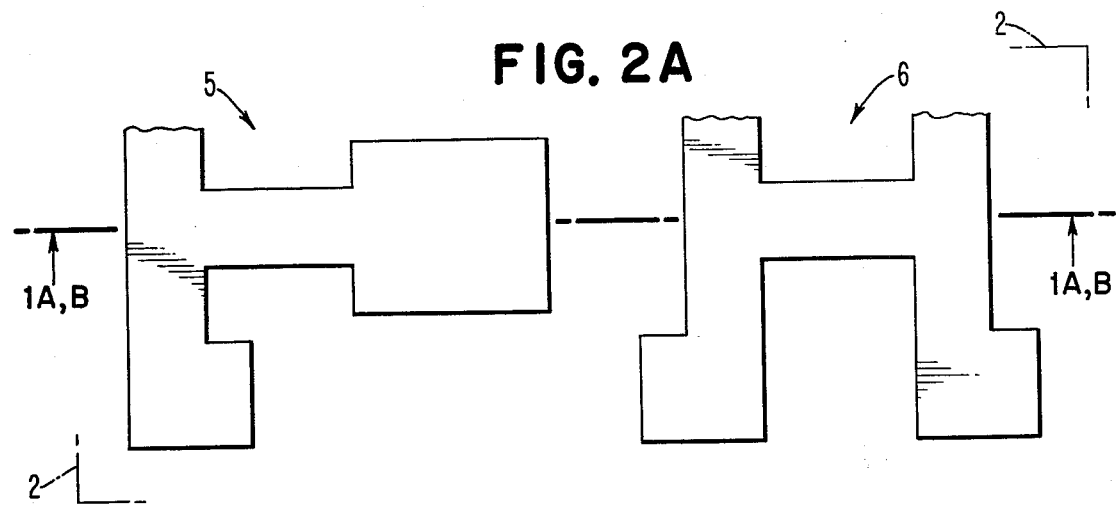
FIGS. 2A–2E show a top view of the sequence and relative positioning of the five basic lithographic masks employed according to the present invention.

FIG. 1A shows the recessed field oxide regions 3 and their associated implanted p-type channel stopper regions 4 fabricated following the technique disclosed in U.S. Pat. No. 3,899,363. The field oxide isolation regions are about 4,000 to 10,000 A thick and are fully recessed with respect to the silicon surface. The lithographic mask shown in FIG. 2A is used to delineate the field oxide regions 3 as distinguished from the enhancement-mode and depletion-mode device regions 5 and 6, respectively. This is the first basic lithographic masking step. The mask is of a transparent material having opaque portions in a predetermined pattern. It is noted that the enhancement-mode and depletion-mode devices may be located within the same device region or may occupy separate device regions.

A thin enhancement-mode FET gate insulator layer of silicon dioxide 7 is grown on or deposited onto the silicon substrate 2. This gate insulator, which is about 200 to 1,000 Angstroms thick, is preferably formed by thermal oxidation of the silicon surface at 1,000° C in the presence of dry oxygen. It is noted that, when desired, the p-type doping at the semiconductor surface in regions 5 and 6 can be increased by ion implantation or diffusion of boron. As shown in the art, this additional low-concentration surface doping is used to increase the gate threshold voltage of the enhancement-mode FET to a desired value and to prevent source to drain depletion layer punch-through or short-channel effects. The technique of enhanced surface doping is described, for example, by V. L. Rideout et al in "Device Design Considerations for Ion-Implanted n-Channel MOSFETs", IBM J. Res. Develop., Vol. 19, No. 1, pp. 50–59, Jan. 1975. The additional surface doping may be provided prior to or subsequent to forming gate oxide layer 7 as desired.

A layer of polycrystalline silicon 8 is then deposited. The polysilicon layer is approximately 1500 to 5000 A thick, and may be formed by chemical-vapor deposition. The polysilicon layer is now doped with an n-type dopant such as arsenic, phosphorus, or antimony by one of several conventional techniques. Preferably, the polysilicon is doped with phosphorus and preferably uses the techniques of depositing a $POCl_3$ layer and heating it to approximately 870° C to drive the phosphorus into the polysilicon making it n-type. After this, the residual of the $POCl_3$ layer is removed by etching the water in buffered hydrofluoric acid. A thin surface protection layer of silicon dioxide 9 about 50 to 200 A thick is grown on or deposited onto the polysilicon layer to prevent a subsequently deposited oxidation barrier layer 10 from reacting with the polysilicon and thereby rendering it difficult to later remove the oxidation barrier layer.

An adherent oxidation barrier layer 10 or a non-oxidizing material such as silicon nitride, aluminum nitride, boron nitride, aluminum oxide, or silicon carbide is then deposited. Preferably the layer 10 is of silicon nitride and is approximately 500 to 1000 A thick. The layer 10 may be deposited by conventional chemical-vapor deposition techniques. An additional layer of silicon dioxide 11 is then deposited. The silicon dioxide layer 11 is approximately 500 to 1000 A thick and may be formed by chemical-vapor deposition. This layer 11 serves as an etching mask to delineate the layer 10.

The layer 10 serves as an etching mask to delineate the gate pattern into the silicon-dioxide layer 9, and as an oxidation barrier layer during subsequent growth of the insulation oxide over other parts of the structure. The oxidation barrier layer material should not oxidize, or at most only oxidize extremely slowly relative to the oxidation rate of silicon and polysilicon. The oxidation barrier layer material is considered to be a nonoxidizing material under the conditions to which it is subjected in the method of the present invention. The oxidation barrier layer 10 is preferably a nitride such as silicon nitride and it prevents oxidation of the upper surface of the polysilicon layer 8 thereunder.

Figure 1B:
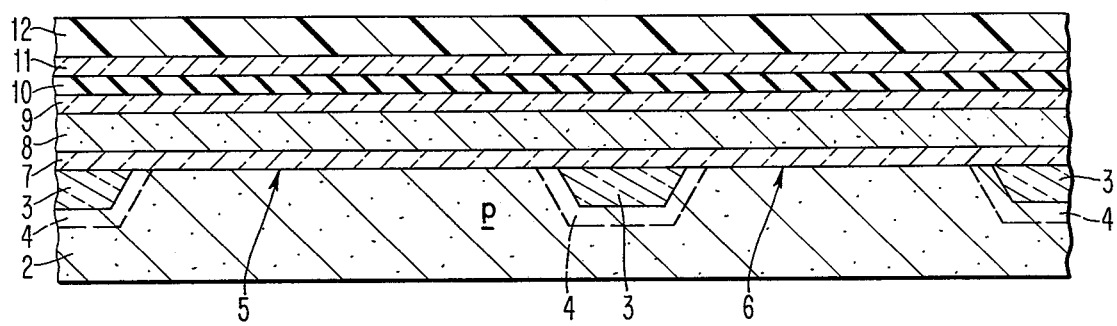

A gate pattern determining layer such as a layer of resist material 12 of the type employed in known lithographic masking and etching techniques is placed over the surface of the upper oxide layer 11. Any of the well-known photosensitive polymerizable resist materials known in the art may be used. The resist material is applied such as by spinning on or by spraying. The resultant structure is shown in FIG. 1B.

Figure 2B:
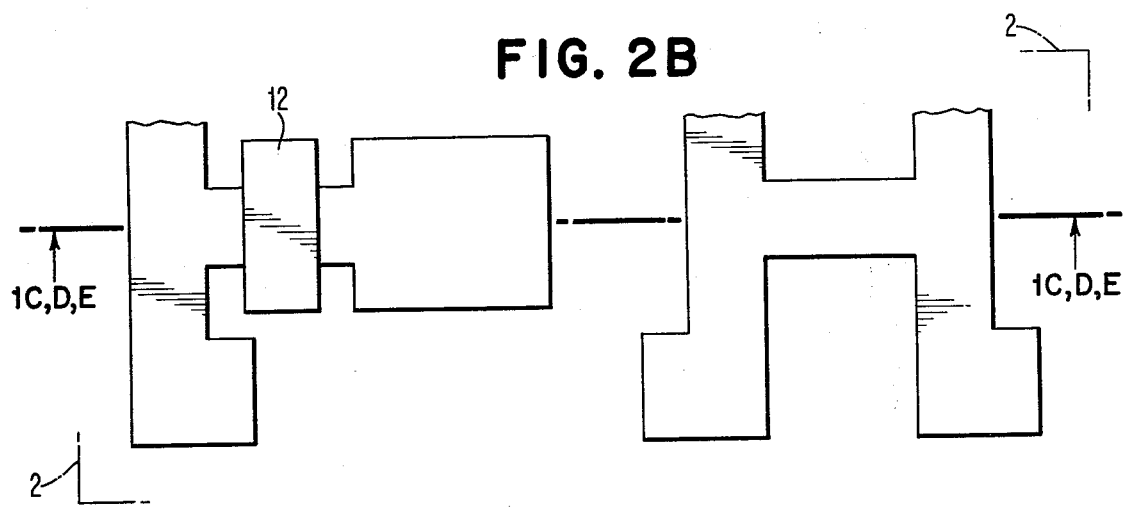

The layer of photoresist material 12 is dried and then selectively exposed to ultraviolet radiation using the photolithographic mask shown in FIG. 2B. The mask is of a transparent material having opaque portions in a predetermined pattern. The masked wafer is subjected to ultraviolet light which polymerizes the portions of the resist material underlying the transparent regions of the mask. After removing the mask, the wafer is rinsed in a suitable developing solution which washes away the portions of the resist material which were under the opaque regions of the mask and thus not exposed to the ultraviolet light. The assembly may then be baked to further polymerize and harden the remaining resist material which conforms to the desired masking pattern, i.e., it covers the regions in which the polysilicon enhancement-mode FET gate regions will subsequently be formed.

Figure 1C:
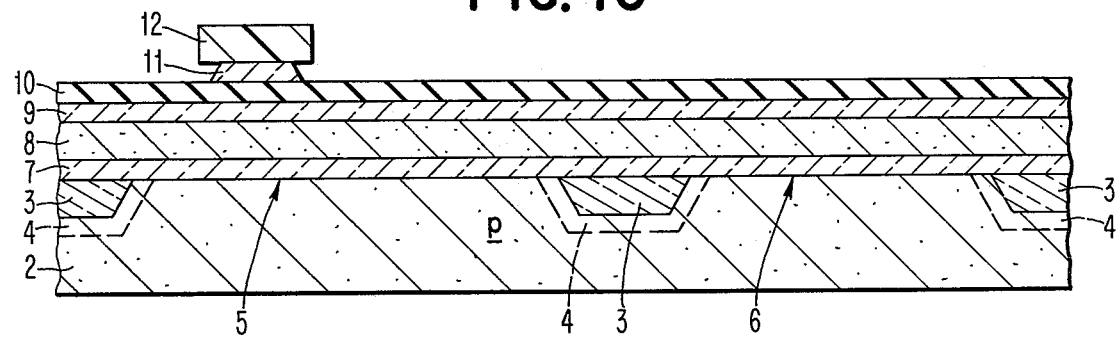

Next the structure is treated to remove the portions of the silicon dioxide 11 not protected by the resist material 12. The wafer is immersed in a solution of buffered hydrofluoric acid. The etching solution dissolves silicon dioxide but does not attack the resist, oxidation barrier layer 10 such as silicon nitride, or other materials of the assembly, as illustrated by FIG. 1C.

The photoresist material 12 above the pattern etched into silicon dioxide layer 11 is then removed by dissolving in a suitable solvent. The remaining silicon dioxide regions 11 conform to a predetermined pattern, and now serve as a mask for etching predetermined patterns in the oxidation barrier layer 10. Patterns in layer 10 then serve as a mask for etching patterns in the thin oxide layer 9, and patterns in layer 9 in turn serve as a mask for etching patterns in the polysilicon layer 8. Patterns in polysilicon layer 8 then serve as a mask for etching patterns in silicon dioxide layer 7.

Figure 1D:
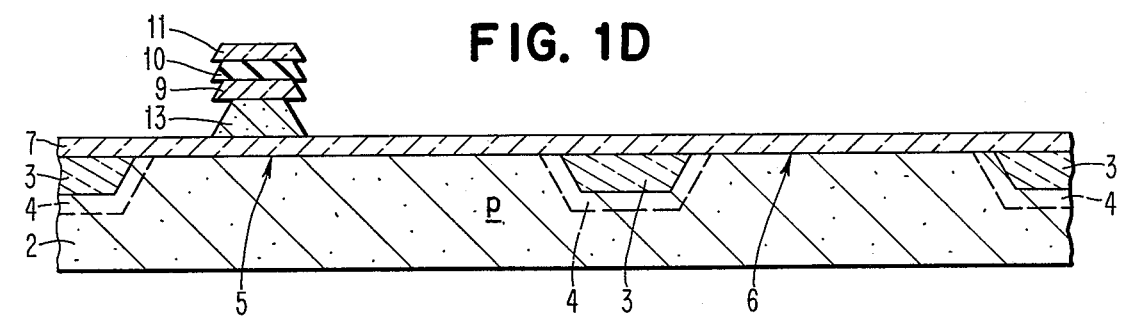

Patterns in the layer 10, when silicon nitride is employed, can be formed by etching in a phosphoric acid solution at 180° C. Patterns in the thin oxide layer 9 formed by etching in a solution of buffered hydrofluoric acid. Patterns in the polysilicon layer 8 are formed by etching in a well-known etchant such as ethylene diamine pyrocatechol at 100° C. This completes the second basic lithographic masking step which delineates the polysilicon gate electrode 13 of the enhancement-mode FET as illustrated in FIG. 1D.

Next those portions of thin silicon dioxide layer 7 not under the n-type polysilicon gate 13 are removed by etching in a solution of buffered hydrofluoric acid. The etchant also removes all or most of the remaining regions of oxide layer 11. Any part of layer 11 not removed can be removed at a later step by a short time or "dip" etch in buffered hydrofluoric acid.

Although it is generally preferable to remove the exposed portions of thin layer 7 at this stage of the process, they can be retained and removed subsequently such as after providing the n-type doping for the channel regions of the depletion-mode FETs and for the lower doped silicon electrodes of the storage capacitors, or even retained throughout the entire process, as desired.

Next a thin insulating layer 18 is formed. This insulator layer is grown on or deposited onto the assembly. Layer 18 is approximately 200 to 1000 A thick, is preferably of silicon dioxide, and is preferably formed by thermal oxidation of the assembly at 1000° C in the presence of dry oxygen. Layer 18 serves as both the dielectric insulation between electrodes of the storage capacitor to be formed adjacent to the enhancement-mode FET and as the gate insulation of the depletion-mode FET to be formed in region 6. The exposed portions of the thin silicon dioxide layer 7 are preferably but not necessarily removed prior to forming the thin insulation layer 18. When layer 7 is completely retained, the thickness of the gate insulator of the depletion-mode FET will exceed that of the enhancement-mode FET.

An advantage of the present invention is that the enhancement-mode FET gate insulator layer 7 and the depletion-mode FET gate and storage capacitor insulator layer 18 can be of different thicknesses. For instance, it may be desirable to make the storage capacitor insulator thinner than the enhancement-mode FET gate insulator in order to increase the capacitance of the storage capacitor; whereas, the enhancement-mode FET gate insulator could be thicker to prevent breakdown due to the voltages experienced by that gate insulator during operation.

Figure 1E:
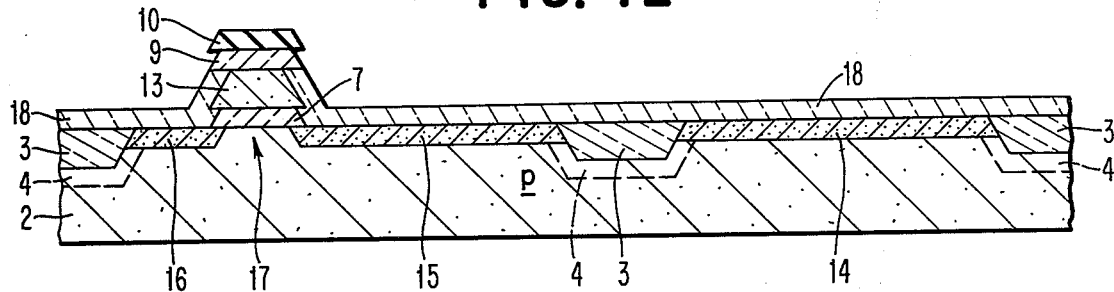

The thin insulator layer 18 is preferably formed prior to the thermal diffusion or ion implantation of the n-type impurities, and is thin enough that the n-type impurities pass therethrough. However, if desired, the thin storage capacitor insulator layer 18 can be formed subsequent to the ion implantation or thermal diffusion of the n-type impurities. The n-type impurities are ion implanted or thermally diffused to dope the exposed regions 14, 15 and 16 of the silicon substrate as shown in FIG. 1E. These impurities provide the n-type doping for the channel region 14 of the depletion-mode FET to be formed in region 6, and the silicon lower electrode 15 of the storage capacitor. Region 16 will later become the drain region (bit line) of the enhancement-mode FET. When low-concentration p-type dopants are used to enhance the surface doping in regions 5 and 6, the n-type impurity concentration in region 6 is large enough to overcome the effect of the p-type impurities and to provide a negative gate threshold voltage for the depletion-mode FET.

The n-type impurities do not enter the channel region 17 of the enhancement-mode FET because of the blocking action of the gate electrode 13 and of the remaining portions of layers 7, 9, and 10. Similarly, the thick field oxide 3 prevents n-type impurities from entering the silicon substrate beneath field isolation region 3.

For purposes of illustrating the present invention, ion implantation of n-type impurities has been selected. For instance, a shallow, lightly doped, n-type region can be formed in the silicon substrate beneath insulation layer 18 by a $P^{31}$ implant of about 75 KeV energy and about $10^{12}$ atoms/cm$^2$ dose when a 500 A thick silicon dioxide capacitor insulator layer 13 is formed prior to the ion implantation.

Figure 3:
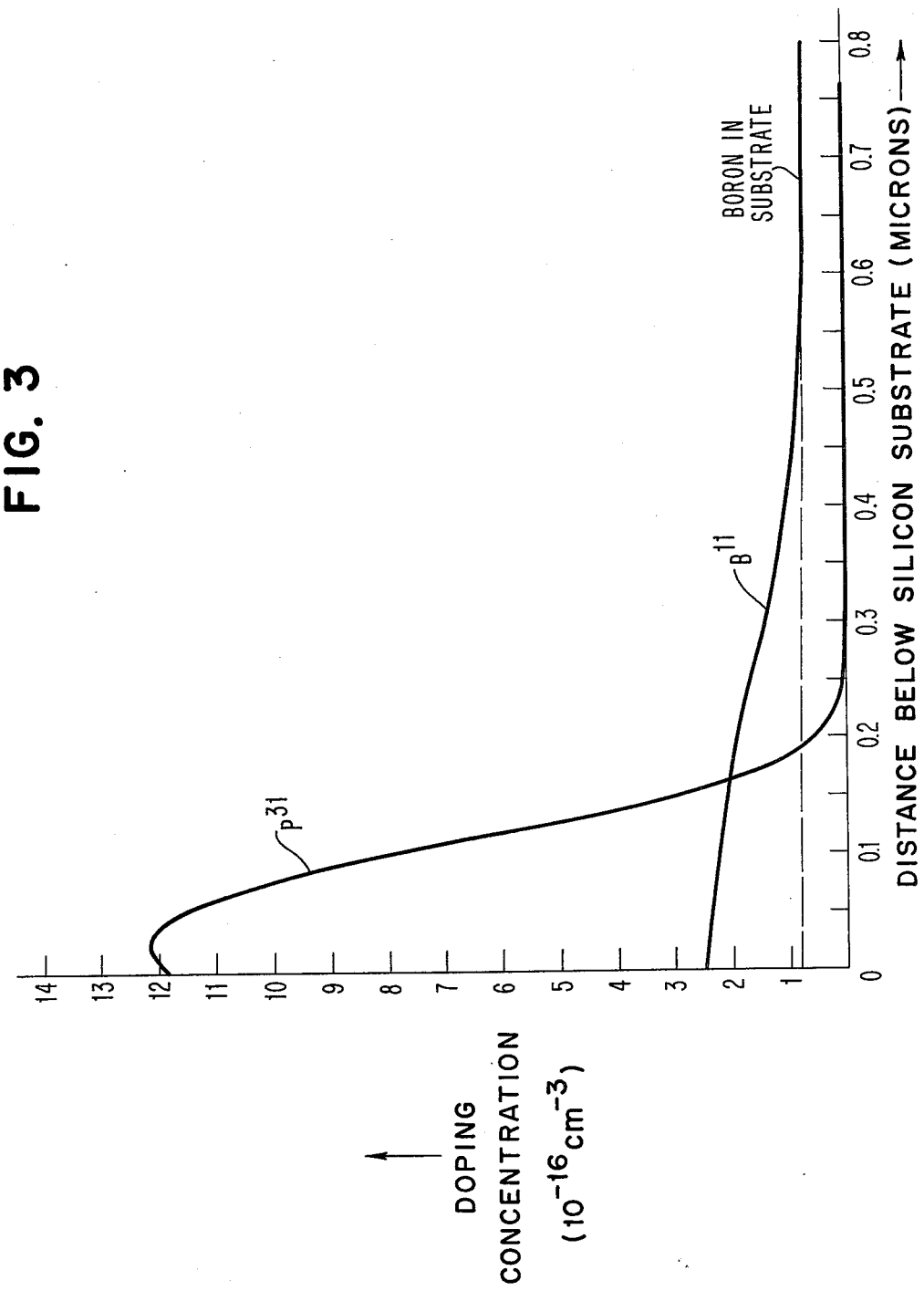
FIG. 3 shows the doping profile of the channel region of the depletion-mode device as predicted by a numerical computer model.

The n-type doping profile as predicted by a numerical computer analysis program is shown in FIG. 3 for a 2 ohm-cm ($7.5 \times 10^{15}$ cm$^{-3}$) p-type substrate. The profile prediction program is described by F. F. Morehead in "A General Calculation of the Redistribution of Ion Implanted Profiles in MOS and Other Processing", ECS Fall Meeting Extended Abstracts, pp. 474–475, Oct. 13–17, 1974. When the ion implantation is performed prior to the formation of the insulation layer 18, a $P^{31}$ implant of about 50 KeV energy and about $10^{12}$ atoms/cm$^2$ dose is employed.

The magnitude of the n-type doping provided by the implantation is too small by several orders of magnitude to also provide source and drain regions suitable for FET operation. In particular, the resistance in the regions which subsequently are to be FET drain and source regions is thus far very high. Also, shallow lightly-doped regions of the general magnitude formed herein are extremely difficult to be electrically contacted by metallic interconnection lines.

A second layer of polysilicon 19 is then deposited over the entire structure. Polysilicon layer 19 can be either p- or n-type, but preferably is also n-type. The polysilicon layer is approximately 3500 to 5000 A thick and may be formed by chemical-vapor deposition. The polysilicon is doped with $POCl_3$ as described hereinabove. After doping, a layer 20 of silicon dioxide 500 to 1000 A thick is grown on or is deposited onto the second polysilicon layer. Preferably the silicon dioxide is deposited by conventional chemical-vapor deposition techniques. The residual of the $POCl_3$ layer need not be removed prior to forming the silicon dioxide layer 20.

It is noted that the depletion-mode channel region 14 and lower capacitor electrode region 15 are formed by ion implantation or diffusion, after delineating the enhancement-mode polysilicon gate electrode 13 but before delineating the upper storage capacitor electrode and the depletion-mode FET gate in the second layer of polysilicon 19. The n-type ion implantation or thermal diffusion must be carried out before the step of depositing the second polysilicon layer 19 in order to form an n-type channel region 14 beneath the depletion-mode polysilicon gate and an n-type, doped silicon, lower capacitor electrode under the polysilicon capacitor upper electrode.

Figure 1F:
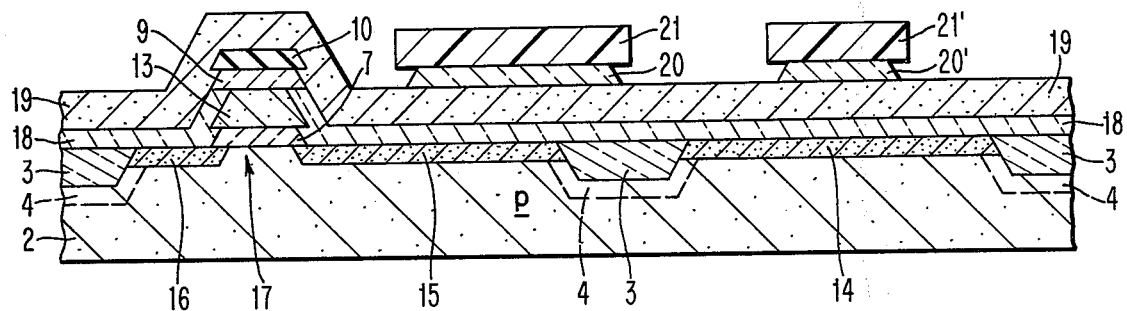

A layer of resist material 21 of the type described previously for defining the enhancement-mode gate pattern is now used to define the polysilicon depletion-mode gate and the polysilicon upper capacitor electrode patterns. The resist material 21 is applied, exposed with ultraviolet radiation using the lithographic masking pattern shown in FIG. 2C, and the unexposed regions of the resist are dissolved away. This is the third basic lithographic masking step. Next, the structure is treated to remove the portions of the silicon dioxide 20 not protected by the resist material 21 as illustrated by FIG. 1F.

Figure 1G:
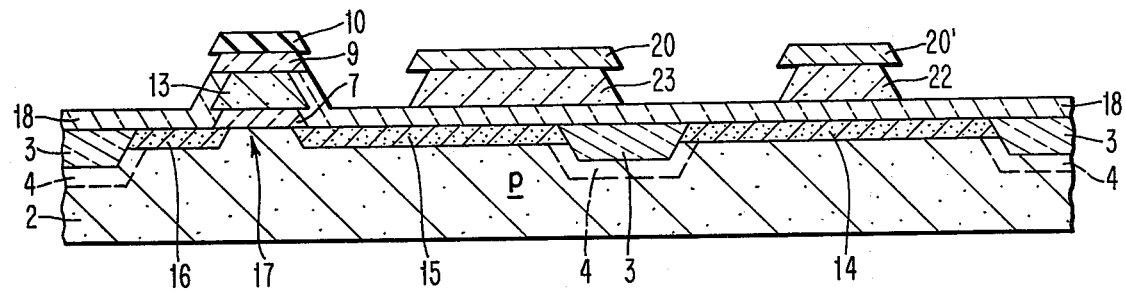
Figure 2C:
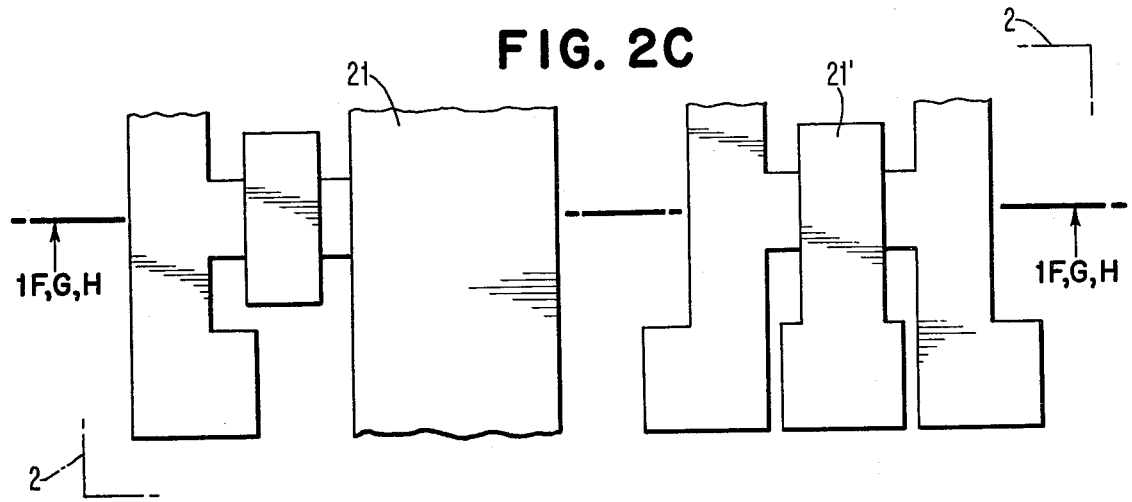

The wafer is immersed in a solution of buffered hydrofluoric acid which dissolves the exposed parts of silicon dioxide layer 20 but does not attack resist, oxidation barrier layer such as silicon nitride, silicon, or other materials of the assembly. The remaining photoresist regions 21 and 21' above the etched silicon dioxide patterns 20 and 20' are then removed by dissolving in a suitable solvent. The remaining portions of silicon dioxide 20 and 20' conform to predetermined depletion-mode gate and upper storage capacitor electrode patterns 22 and 23 respectively as shown in FIG. 2C. The depletion-mode polysilicon gate and the polysilicon upper capacitor electrode patterns 22 and 23 respectively are formed by etching in a well-known etchant such as ethylene diamine pyrocatechol at 100° C. The etchant does not attack the enhancement-mode polysilicon gate regions 13 which are covered on the sides with a protective layer of silicon dioxide 18 and on the top with an oxidation barrier layer 10 and oxide layer 9 as shown in FIG. 1G because the etchant does not attack silicon dioxide or silicon nitride. The defining regions of silicon dioxide 20 and 20' are preferably retained over the polysilicon regions 22 and 23 because they enhance the thickness of the dielectric insulation over the polysilicon regions as illustrated in FIG. 1G.

The high concentration n-type source and drain regions of both the enhancement-mode and depletion-mode FETs are now formed by well-known ion implantation or diffusion techniques. Exposed portions of silicon dioxide layer 18 may be removed prior to implanting or diffusing the source and drain regions of the FETs. Preferably the layer 18 is retained and the source and drain regions formed by implanting through exposed portions of layer 18. For purposes of illustrating the present invention, ion implantation has been selected. For instance, the n-type source and drain regions 24 and 25 respectively of the enhancement-mode FET, and source and drain regions 26 and 27 respectively of the depletion-mode FET can be formed 2000 A deep by an $As^{75}$ implant of about 100 KeV energy and $4 \times 10^{15}$ atoms/cm² dose. It is noted that this dose and the resultant doping concentration are about four thousand times greater than that required for the n-type depletion-mode channel region 14 and lower capacitor electrode 15. This additional n-type implantation or diffusion is performed to provide the high electrical conductivity necessary for the source and the drain regions of the FETs. This n-type doping does not enhance the conductivities of the lower electrode 15 of the capacitor due to the blocking action of the polysilicon upper capacitor electrode 23 and its associated portion of silicon dioxide 20, nor does it enhance the conductivity of the depletion-mode channel region 14 due to the blocking action of the polysilicon depletion-mode FET gate electrode 22 and its associated portion of silicon dioxide 20'. The doping concentration providing the source regions 24 and 26 and the drain regions 25 and 27 is between about 10 and 100,000 times greater and preferably between about 1000 and 10,000 times greater than the doping concentration employed in providing the doping for the depletion-mode channel and the lower electrode of the storage capacitor. The n-type doping ions employed can be the same chemical species as those used for the depletion channel and lower electrode of the storage capacitor, or can be different n-type species.

The boundaries between the n-type source and drain regions and the channel of the FET are determined by the polysilicon gate. This is generally referred to in the prior art as the "self-aligned gate technique". With the gate self-aligned with respect to the source and drain, the parasitic gate to source and drain overlap capacitances are advantageously reduced over other FET fabrication techniques. It is noted that the polysilicon upper capacitor electrode 23, when desired, can be spaced arbitrarily close or even overlap onto the polysilicon gate 13 because regions 23 and 13 are formed in separate lithographic steps.

Figure 1H:
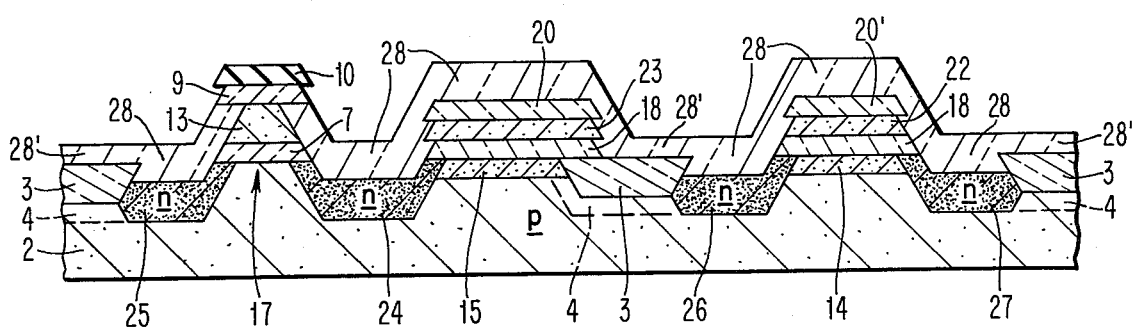

Next, a dielectric insulation layer 28 is formed above the polysilicon plate 23, above the depletion mode gate 22, and above the n-type sources 24 and 26 and drains 25 and 27 as shown in FIG. 1H. Insulation layer 28 does not form over the enhancement-mode gate 13. Formation of layer 28 also increases the thickness of the field oxide 3 in those regions 28' not covered by polysilicon plate 23 or by depletion-mode polysilicon gate 22. It is noted that the insulation layer 28 does not affect to any serious degree the n-type lower capacitor electrode 15 which is situated under the polysilicon capacitor plate, nor the n-type depletion-mode channel region 14 which is situated under the polysilicon depletion-mode gate 22 as shown in FIG. 1H. Layer 28 electrically insulates the subsequently formed metallic-type line to the gates from the upper capacitor electrode 23, and from the n-type source and drain regions. Layer 28 also decreases the capacitive coupling between the metallic-type interconnection line and upper capacitor electrode, source, drain and substrate regions. Accordingly, layer 28 should be as thick as possible, but not so thick as to cause degradation of or discontinuities in the conductive lines to any undesired extent, nor so thick that the polysilicon gate 22 and capacitor electrode 23 are consumed during oxidation to any undesired extent.

The dielectric insulation 28 over the upper capacitor electrode and over the n-type sources 24 and 26 and drains 25 and 27 is formed by growing a silicon dioxide layer 1500 to 5000 A thick by thermal oxidation at 1000° C in the presence of steam. During this oxidation, about 600 to 2000 A of the 3500 A thick polysilicon plate is converted to silicon dioxide, and about 600 to 2000 A of the silicon substrate over the n-type source and drain regions is also converted to silicon dioxide. The n-type sources 24 and 26 and drains 25 and 27 are driven down into the substrate and laterally around the growing oxide as shown in FIG. 1H. Since the oxide tends to expel n-type dopants, the n-type dopant is not consumed to any significant extent during this oxidation. The top of the enhancement-mode gate 13 is protected from oxidation by an oxidation barrier layer 10, whereas the sides of the gate 13 are subjected to the oxidation which desirably provides protective insulation up to the non-oxidizing layer 10. During oxidation the thickness of the field oxide 3 in those regions 28' not covered by polysilicon regions 22 and 23 is advantageously increased by about 500 to 1500 A.

Next, the enhancement-mode polysilicon gate 13 is revealed. First, any part of layer 11 still remaining is now removed by a short time or "dip" etch in hydrofluoric acid. Next, the silicon nitride oxidation barrier layer 10 over the gate is removed by etching in a phosphoric acid solution at 180° C. Then, the thin oxide layer 9 is removed by dip etching in a buffered hydrofluoric acid solution.

In fabricating FET integrated circuits, it is necessary to connect high-electrical conductivity lines to the polysilicon upper capacitor electrode, to the polysilicon depletion-mode gate, and to n-type silicon source and drain regions. These connections do not occur in the array of one-device memory cells, but are in the outer lying addressing, decoding and sensing circuits referred to as peripheral circuits.

Figure 1I:
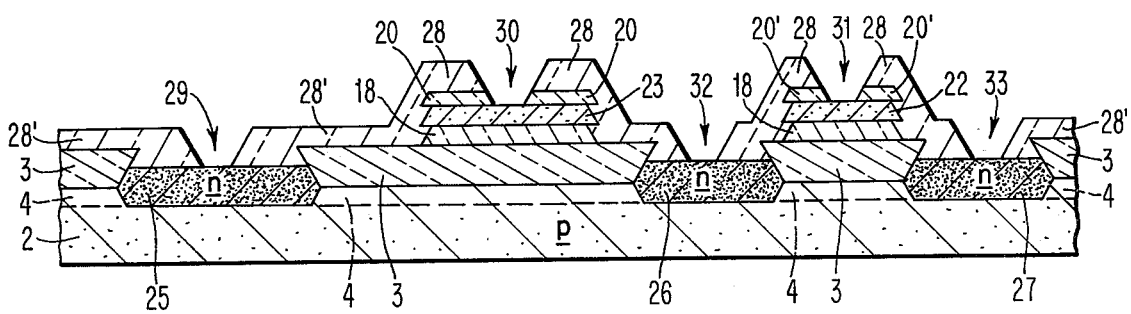
Figure 2D:
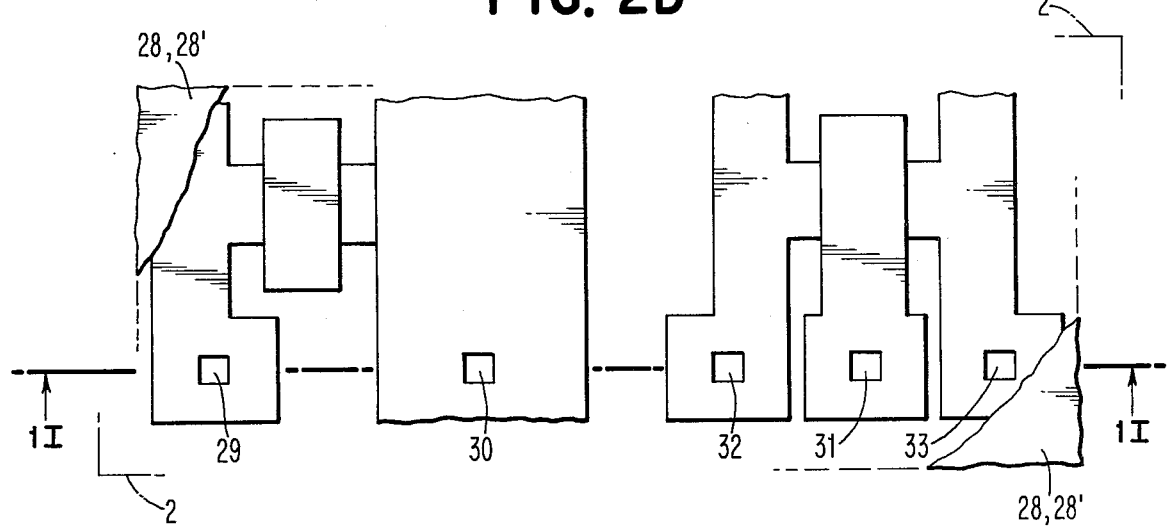

The electrical connections are fabricated by applying a photoresist layer to the assembly. The resist material is exposed with ultraviolet radiation using the lithographic masking pattern shown in FIG. 2D, and the unexposed regions of the resist are dissolved away. This is the fourth basic lithographic masking step. Next, the structure is treated to remove the portions of the silicon dioxide not protected by the resist material. The wafer is immersed in a solution of buffered hydrofluoric acid to provide contact holes or vias 29, 30, and 31 through the oxide insulation layer 28 to allow electrical connection to be made to the drain 25 of the enhancement-mode FET, to the polysilicon upper electrode 23 of the storage capacitor, and to the polysilicon gate electrode 22 of the depletion-mode FET as shown in FIG. 1I. Source region 24 can, of course, be contacted in the above-mentioned manner where desired. FIG. 2D also shows representative contact holes 32 and 33 to the source 26 and drain 27 regions of the depletion-mode FET. The remaining photoresist above the etched silicon dioxide is then removed by dissolving in a suitable solvent. Now the n-type drain region 25, the polysilicon plate region 23, and the polysilicon gate 22 of the depletion-mode FET in the contact holes 29, 30, and 31, respectively, also have been revealed for contacting. It is noted that the sequence of removing nonoxidizing layer 10, and then etching contact holes 29, 30, and 31 may be reversed without seriously affecting the final structure. The polysilicon gate of the enhancement-mode FET was previously revealed for contacting by dissolving the oxidation barrier layer with an etchant.

Next, the metallic-type high electrical conductivity interconnection line material 34, preferably a metal, is deposited and the interconnection pattern is delineated. An example of a highly-conductive material commonly used for interconnections is aluminum which may contain relatively small amounts of impurities introduced to decrease electromigration effects or to prevent or reduce chemical reactions between the aluminum and the semiconductive material to be contacted. The high-electrical conductivity material such as aluminum may be deposited by sputtering or, preferably, by evaporation.

It is noted that a barrier layer (not shown) may be placed between the aluminum and the silicon or polysilicon semiconductive material to prevent or reduce chemical reaction between the aluminum and the semiconductive material. The barrier layer may be of a metal such as titanium or chromium, or of an intermetallic silicide such as platinum silicide or palladium silicide.

Figure 1J:
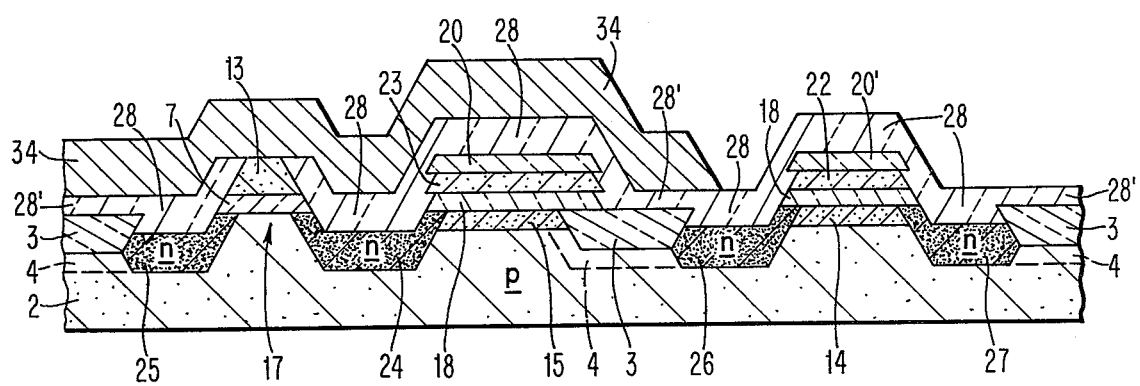

Next, a photoresist layer is applied to the assembly. The resist material is exposed with ultraviolet radiation using the predetermined mask pattern shown in FIG. 2E and the unexposed regions of the resist are dissolved away. This is the fifth basic lithographic masking step. Then the structure is treated to remove the portions of the conductive material not protected by the resist as illustrated in FIG. 1J. When a barrier layer is employed under the conductive material, the pattern in the conductive material can serve as an etching mask for delineating the barrier layer.

Figure 2E:
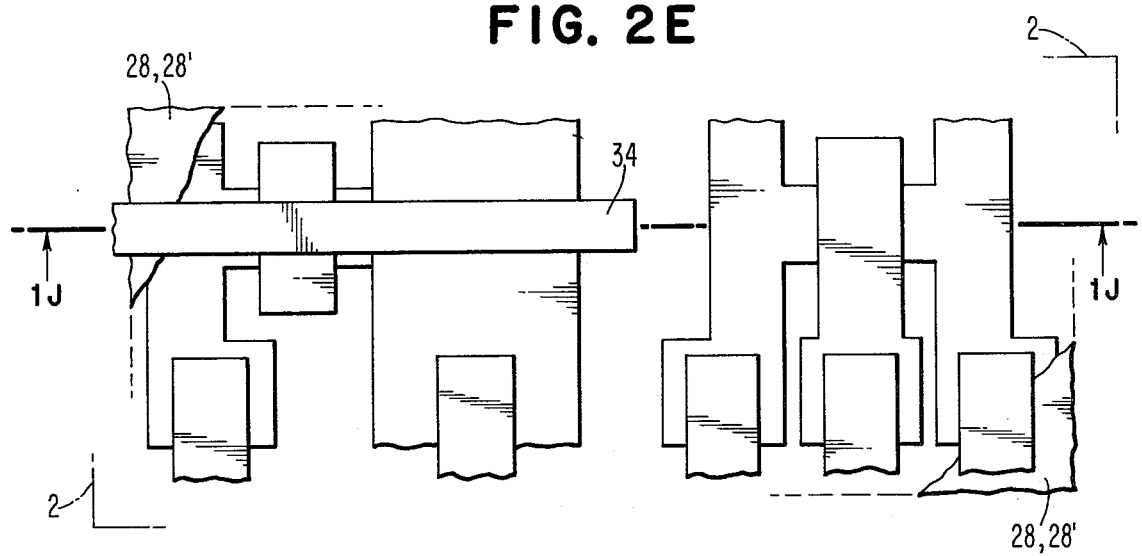

FIG. 2E illustrates a top view of the mask patterns for an FET one-device memory cell and a depletion-mode FET fabricated according to the present invention. The one-device memory cell comprises an enhancement-mode FET switch, and a charge storage capacitor. The depletion-mode FET may be interconnected to the memory cell, or to other enhancement-mode or depletion-mode devices to form peripheral circuits on the same semiconductive substrate. Also, shown in FIG. 2E are the mask patterns for representative electrical connections through vias to the drain of the enhancement-mode FET (i.e., the bit line of the memory cell), to the upper electrode or plate of the storage capacitor, and to source, gate, and drain regions of a depletion-mode FET fabricated according to the present invention. Such representative electrical connections occur in the peripheral circuits.

In other FET processes that use a conventional etched contact hole for connection between the metal word line and the polysilicon gate of the enhancement-mode FET, extreme precision in registration between the contact hole lithographic mask and the polysilicon gate lithographic mask is required. Furthermore, since only that portion of the enhancement-mode gate revealed by the etched contact hole is available for contacting, precise registration between the contact hole lithographic mask and the interconnection line lithographic mask is also required. In the "self-registering" enhancement mode gate contact technique employed in the present invention, the entire polysilicon gate electrode of the enhancement-mode FET is revealed for contacting and the metallic conductive material need merely to cross over any portion of the enhancement-mode polysilicon gate in order to make electrical connections to it. Accordingly, this misregistration tolerant aspect considerably reduces the required degree of registration precision between the polysilicon enhancement-mode gate lithographic mask and the interconnection line lithographic mask.

Another advantage of the present invention is that relatively smaller peripheral circuits may be fabricated with the self-registered gate contact technique than with conventional etched gate contact hole techniques.

As known in the art, further layers (not shown) may be provided over the metallic-type layer 34 such as sputtered silicon dioxide for the purpose of passivating the integrated circuit. Furthermore, as is known in the art, when desired, other masking steps may be used to provide vias through the passivation layer in order to make contact to the metallic interconnection layer or to the semiconductive substrate. Also, as known in the art, electrical connection to the semiconductive substrate may be provided by a metallic layer deposited by evaporation onto the lower or backside surface of semiconductive substrate 2.

FIG. 3 shows the impurity profile under the gate electrode of the depletion-mode device of the present invention as predicted by the aforementioned numerical one-dimensional computer model of Morehead. The same profile will occur under the upper electrode of the charge storage capacitor in the one-device cell of the present invention. The profile illustrated is that anticipated after all process steps have been completed. Presently, no experimental technique is available that gives an accurate measure of such low concentration profiles.

The depletion-mode channel doping of FIG. 3 consists of three parts; the uniform p-type boron substrate doping, the n-type $P^{31}$ depletion-mode channel doping, and the p-type $B^{11}$ enhancement-mode channel doping. The two channel doping concentrations are provided preferably by ion implantation and are used to shift the gate threshold voltage of the FET to more positive (p-type implant) or more negative (n-type implant) voltage values. If the p-type substrate doping concentration is sufficiently large enough (e.g., about $2.5 \times 10^{16} cm^{-3}$) the threshold voltage of the enhancement-mode FET will be of the order of $+1$ to $+2$ volts and no additional p-type doping in the enhancement-mode channel region will be required. In the example considered here, a substrate doping of $7.5 \times 10^{15} cm^{-3}$ is assumed and both enhancement-mode and depletion-mode channel implants are utilized. In the method of the present invention, when it is used, the p-type enhancement-mode implant occurs in the channel regions of both the enhancement-mode and depletion-mode FETs. The n-type depletion-mode channel implant occurs only in the channel region of the depletion-mode FET. The threshold voltage of the depletion-mode FET is of the order of $-3$ volts. Preferably the channel implants are performed after forming the gate insulator which in the example of FIG. 3 was 500 A thick.

Figure 4:
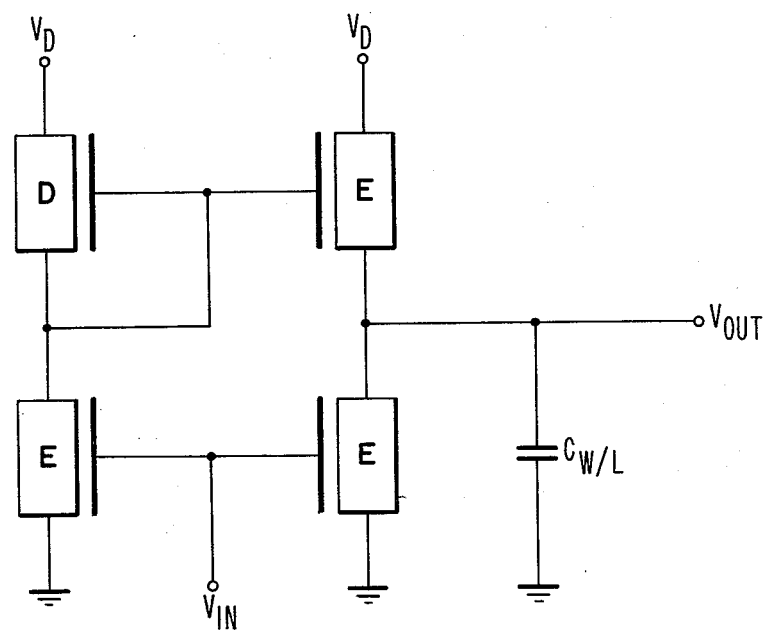
FIG. 4 shows a circuit diagram of a word line driver comprising both enhancement-mode and depletion-mode FETs.

FIG. 4 shows the circuit diagram of a depletion-mode FET (D) and three enhancement-mode FETs (E) interconnected to form a driver circuit. Such a circuit could be used, for instance, to provide the electrical current to the word line of the one-device cells of the present invention. The depletion-mode device serves in this example as a non-linear load device to provide relatively more current per unit time and a larger voltage range during the on-off switching time cycle than a comparable enhancement-mode load element. The depletion-mode load is also superior to a linear resistive load in terms of both switching speed and circuit density. The circuit of FIG. 4 can be fabricated using the method of the present invention which provides both enhancement-mode and depletion-mode FETs.

Figure 5:
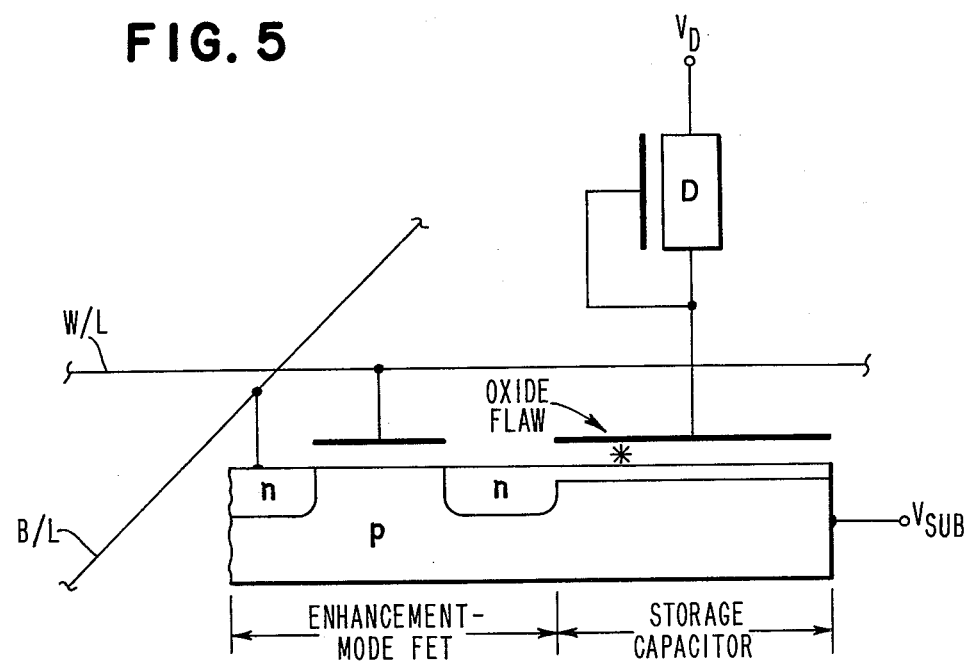
FIG. 5 shows a circuit diagram of a depletion-mode FET used as a current limiter for the upper storage capacitor electrode of a one-device cell memory circuit.

FIG. 5 shows another application of the present invention. In this case the depletion-mode FET (D) is used as a current limiter to supply the DC bias to the upper capacitor electrode which maintains an inversion layer on the silicon substrate beneath the upper capacitor electrode of a one-device cell. Without the depletion-mode device, in the event of an oxide flaw or defect, a large current would flow from the upper electrode to the lower electrode since the upper electrode is held at a potential higher in absolute magnitude than the substrate. The use of the depletion-mode device limits the defect leakage current. These calls are then not accessed or used on the chip, i.e., they remain dormant and do not affect the chip operation as long as their leakage current level is tolerable.

An important aspect made possible by the present invention is that the electrode structure of the depletion-mode device can also be used to provide an electrode structure of a charge storage capacitor in a one-device memory cell. In addition to the resulting structural advantages such as providing an upper electrode over which thick oxide insulation is formed and a self-registering gate contact to the FET switch in the cell, the use of a low-concentration n-type layer as the lower electrode of the charge storage capacitors offers certain biasing advantages. In particular, in other known devices in which the charge storage capacitor is formed along with the enhancement-mode gate electrode structure, an additional voltage level is required for the upper capacitor electrode to maintain an inversion layer under the electrode at the surface of the semiconductive substrate. Generally, the voltage supplied to the upper capacitor electrode is larger in absolute magnitude than the voltage supplied to the word line and different in plurality than that supplied to the semiconductive substrate. When the doping employed to provide the channel doping for the depletion-mode FET is also used to provide the lower electrode of the charge storage capacitor according to the present invention, the threshold voltage necessary to create a surface inversion layer is lowered, and a lower voltage is required for the upper capacitor electrode. This reduction in the need voltage for the upper capacitor electrode makes it possible to operate the word line and the upper capacitor electrode at the same voltage level. This advantageously reduces two different voltage levels to one. In addition, the required magnitude of the bias on the upper electrode of the capacitor is reduced. This in turn lowers the electric field strength across the capacitor dielectric and leads to higher reliability circuits.

What is claimed is:

1. A method for fabricating an array of one-device memory cells and enhancement-mode and depletion-mode FETs on the same semiconductive substrate which comprises:
    (A) providing a semiconductive substrate of a first conductive type containing active impurities of a first conductive type;
    (B) providing and delineating predetermined oxide isolation regions above or recessed into the substrate to provide insulating field oxide regions between said memory cell and said enhancement-mode and said depletion-mode FETs and other memory cells and FETs on the same semiconductive substrate;

(C) providing an enhancement mode FET gate insulator;
(D) depositing and doping a layer of polycrystalline silicon above said gate insulator;
(E) then delineating the predetermined polycrystalline silicon gate regions of the enhancement mode FET with an oxidation barrier layer;
(F) providing a capacitor insulator and depletion-mode FET gate insulator;
(G) thermally diffusing or ion implanting active impurities of a second and opposite conductivity type into predetermined regions of the semiconductive substrate to provide depletion-mode channel regions above which regions are to be subsequently delineated polycrystalline silicon gate regions of depletion-mode FETs; and to provide lower doped silicon electrodes of the storage capacitors above which electrodes are to be subsequently delineated polycrystalline silicon upper electrodes of the storage capacitors of the one-device memory cells;
(H) then depositing and doping a second and subsequent layer of polycrystalline silicon above the capacitor insulator, and above said depletion-mode FET gate insulator;
(I) then delineating the second and subsequent layer of doped polycrystalline silicon to provide upper electrode regions above the corresponding doped lower silicon electrodes of the storage capacitors, and to provide depletion-mode FET gate regions above corresponding doped depletion-mode channel regions;
(J) thermally diffusing or ion implanting active impurities of a second and opposite conductivity type into predetermined regions of the semiconductive substrate and at greater doping concentration than the doping concentration employed in step (G) and being sufficient to provide doped sources and drains of both the enhancement-mode FETs and the depletion-mode FETs;
(K) thermally growing a silicon dioxide insulating layer over regions of the structure but not over the polycrystalline silicon enhancement-mode FET gate which is still protected by an oxidation barrier layer;
(L) removing the oxidation barrier layer from over the enhancement-mode FET gate by use of an etchant;
(M) delineating contact holes to polycrystalline silicon upper capacitor electrodes; to doped sources and drains in circuits peripheral to the array of memory cells; and to polycrystalline silicon depletion-mode FET gates; and
(N) depositing and delineating a metallic-type high-conductivity electrical interconnection pattern that makes electrical connection to the polycrystalline silicon FET gates, to polycrystalline silicon upper capacitor electrodes, and to source and drain regions.

2. The method of claim 1 wherein said semiconductive substrate is a p-type silicon substrate containing active p-type impurities.

3. The method of claim 2 wherein said p-type impurities are selected from the group consisting of boron, aluminum, gallium, and indium.

4. The method of claim 1 wherein said field oxide isolation regions are of silicon dioxide.

5. The method of claim 1 wherein said field oxide isolation regions are recessed into the semiconductive substrate.

6. The method of claim 1 wherein said enhancement-mode gate insulator is a layer of silicon dioxide.

7. The method of claim 1 wherein said active impurities of a second conductive type are n-type dopants.

8. The method of claim 7 wherein said n-type dopant is arsenic, phosphorus or antimony.

9. The method of claim 1 wherein said oxidation barrier layer is of silicon nitride.

10. The method of claim 1 wherein said storage capacitor insulator is a layer of silicon dioxide.

11. The method of claim 1 wherein said interconnection material is a metal.

12. The method of claim 11 wherein said metal is aluminum.

13. The method of claim 1 wherein the enhancement-mode and depletion-mode FETs are electrically interconnected so as to form a random access memory integrated circuit.

14. A method for fabricating an integrated circuit containing a plurality of enhancement-mode and depletion-mode FETs on the same semiconductive substrate which comprises:
(A) providing a semiconductive substrate of a first conductive type containing active impurities of a first conductive type;
(B) providing and delineating predetermined oxide isolation regions above or recessed into the substrate to provide insulating field oxide regions between said enhancement-mode and said depletion-mode FETs and between other FETs on the same semiconductive substrate;
(C) providing an enhancement mode FET gate insulator;
(D) depositing and doping a layer of polycrystalline silicon above said gate insulator;
(E) then delineating the predetermined polycrystalline silicon gate regions of the enhancement mode FET with an oxidation barrier layer;
(F) providing a depletion-mode FET gate insulator;
(G) thermally diffusing or ion implanting active impurities of a second and opposite conductivity type into predetermined regions of the semiconductive substrate to provide depletion-mode channel regions above which regions are to be subsequently delineated polycrystalline silicon gate regions of depletion-mode FETs;
(H) then depositing and doping a second and subsequent layer of polycrystalline silicone above said depletion-mode FET gate insulator;
(I) then delineating the second and subsequent layer of doped polycrystalline silicon to provide depletion-mode FET gate regions above corresponding doped depletion-mode channel regions;
(J) thermally diffusing or ion implanting active impurities of a second and opposite conductive type into predetermined regions of the semiconductive substrate and at greater doping concentration employed in step (G) and being sufficient to provide doped sources and drains of both the enhancement-mode FETs and the depletion-mode FETs;
(K) thermally growing a silicon dioxide insulating layer over regions of the structure but not over the polycrystalline silicon enhancement-mode FET gate which is still protected by an oxidation barrier layer;

(L) removing the oxidation barrier layer from over the enhancement-mode FET gate by use of an etchant;

(M) delineating contact holes to doped sources and drains and to polycrystalline silicon depletion-mode FET gates; and (N) depositing and delineating a metallic-type high-conductivity electrical interconnection pattern that makes electrical connection to the polycrystalline silicon FET gates and to source and drain regions.

15. The method of claim 14 wherein said semiconductive substrate is a p-type silicon substrate containing active p-type impurities.

16. The method of claim 15 wherein said p-type impurities are selected from the group consisting of boron, aluminum, gallium, and indium.

17. The method of claim 14 wherein said field oxide isolation regions are of silicon dioxide.

18. The method of claim 14 wherein said field oxide isolation regions are recessed into the semiconductive substrate.

19. The method of claim 14 wherein said enhancement-mode gate insulator is a layer of silicon dioxide.

20. The method of claim 14 wherein said active impurities of a second conductive type are n-type dopants.

21. The method of claim 20 wherein said n-type dopant is arsenic, phosphorus or antimony.

22. The method of claim 14 wherein said oxidation barrier layer is of silicon nitride.

23. The method of claim 14 wherein said storage capacitor insulator is a layer of silicon dioxide.

24. The method of claim 14 wherein said interconnection material is a metal.

25. The method of claim 24 wherein said metal is aluminum.

26. Method of forming a semiconductor integrated circuit which comprises electrically interconnecting the enhancement-mode and depletion-mode FETs prepared by the method of claim 14 so as to form a semiconductor integrated circuit.

* * * * *